United States Patent [19]

Ashinuma et al.

[11] Patent Number: 5,289,451

[45] Date of Patent: Feb. 22, 1994

[54] OPTICAL INFORMATION RECORDING/REPRODUCTION APPARATUS INCLUDING MEANS FOR DETECTING THE TYPE OF RECORDING MEDIUM

[75] Inventors: Takaaki Ashinuma; Shigeru Aoi; Makoto Shiho, all of Yokohama; Yasuo Suzuki, Tokyo; Takehiko Shibata, Kokubunji; Masaharu Tsukada, Kawasaki; Nobuhiro Kasama, Yokohama; Takayuki Aizawa, Tokyo, all of Japan

[73] Assignee: Canon Kabushiki Kaisha, Tokyo, Japan

[21] Appl. No.: 953,774

[22] Filed: Sep. 30, 1992

Related U.S. Application Data

[63] Continuation of Ser. No. 643,086, Jan. 22, 1991, abandoned, which is a continuation of Ser. No. 122,647, Nov. 12, 1987, abandoned, which is a continuation of Ser. No. 802,717, Nov. 27, 1985, abandoned.

[30] Foreign Application Priority Data

| Nov. 29, 1984 | [JP] | Japan | 59-252382 |
| Dec. 5, 1984 | [JP] | Japan | 59-255796 |
| Dec. 10, 1984 | [JP] | Japan | 59-259280 |
| Dec. 10, 1984 | [JP] | Japan | 59-259281 |
| Dec. 12, 1984 | [JP] | Japan | 59-262540 |
| Dec. 12, 1984 | [JP] | Japan | 59-262541 |
| Dec. 12, 1984 | [JP] | Japan | 59-262542 |
| Dec. 27, 1984 | [JP] | Japan | 59-280645 |
| Dec. 30, 1984 | [JP] | Japan | 59-280847 |
| Jan. 10, 1985 | [JP] | Japan | 60-1453 |

[51] Int. Cl.⁵ ............................................. G11B 7/00
[52] U.S. Cl. ................................. 369/58; 369/54; 369/44.29; 369/47; 369/48; 369/116; 360/69
[58] Field of Search ............... 369/13, 32, 33, 41, 369/43, 44.25–44.36, 47, 48, 50, 52–54, 58, 116, 233; 360/60, 69, 25, 27

[56] References Cited

U.S. PATENT DOCUMENTS

| 3,790,288 | 2/1974 | Hostetter | 330/86 |
| 4,292,511 | 9/1981 | Heyman et al. | |
| 4,292,596 | 9/1981 | Ishizuka et al. | 330/86 |
| 4,527,265 | 7/1985 | d'Alayer de Costemore d'Arc | 369/233 |
| 4,554,651 | 11/1985 | Kanai et al. | 369/13 |
| 4,562,489 | 12/1985 | Gaskell et al. | 360/27 |
| 4,580,255 | 4/1986 | Inoue et al. | 369/44 |
| 4,611,317 | 9/1986 | Takeuchi et al. | 369/58 |
| 4,644,419 | 2/1987 | Iinuma et al. | 360/73 |
| 4,688,203 | 8/1987 | Koishi et al. | 369/48 |
| 4,928,193 | 5/1990 | Agoglia et al. | 360/69 |
| 5,042,020 | 8/1991 | Endo | 369/44.31 |

FOREIGN PATENT DOCUMENTS

| 55-113170 | 9/1980 | Japan . | |
| 57-100605 | 6/1982 | Japan | 360/67 |
| 57-127904 | 8/1982 | Japan | 360/67 |
| 58-56254 | 4/1983 | Japan | 369/58 |
| 59-42653 | 3/1984 | Japan . | |
| 59-60742 | 4/1984 | Japan | 369/54 |
| 59-98333 | 6/1984 | Japan | 369/116 |
| 59-215076 | 12/1984 | Japan | 369/33 |
| 60-251557 | 12/1985 | Japan . | |
| WO84/04417 | 11/1984 | PCT Int'l Appl. | 369/48 |
| 2133914 | 8/1984 | United Kingdom | 369/13 |

Primary Examiner—Jerry Smith
Assistant Examiner—Steven R. Garland
Attorney, Agent, or Firm—Fitzpatrick, Cella, Harper & Scinto

[57] ABSTRACT

An optical information recording/reproducing apparatus for stably recording, reproducing, or erasing the information by a laser beam with respect to different kinds of optical disks is represented. This apparatus includes a processor to record, reproduce, or erase the information for an optical disk, a disk sort detector to detect the sort of optical disk, and a controller to control the processing parameters of the processor in response to an output signal from the disk sort detector. The disk sort detector reads the disk sort identifying information preliminarily recorded on the optical disk by the processor to detect the sort of disk. Or, this detector irradiates light onto labels having different reflection factors or transmission factors preliminarily provided on the optical disks by the processor and detects the reflected light amounts or transmitted light amounts from the labels, thereby detecting the sort of disk. The optical disks include disks of the type only for use of reproduction, the rerecordable type, and the writable type.

23 Claims, 14 Drawing Sheets

FIG. 4
| $V_\beta$ \ $V_\alpha$ | LOW | HIGH |
|---|---|---|
| LOW | ROM | DRAW |
| HIGH | — | E-DRAW |
FIG. 5
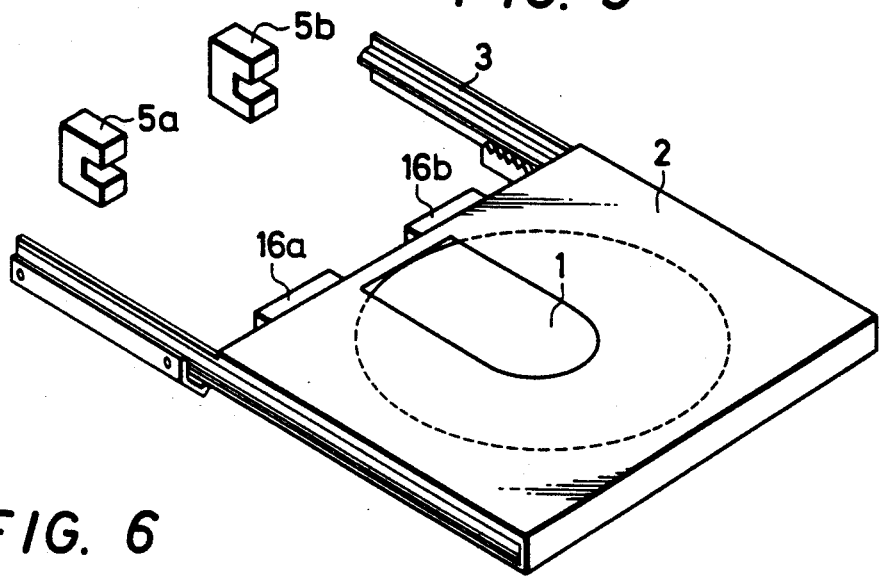
FIG. 6
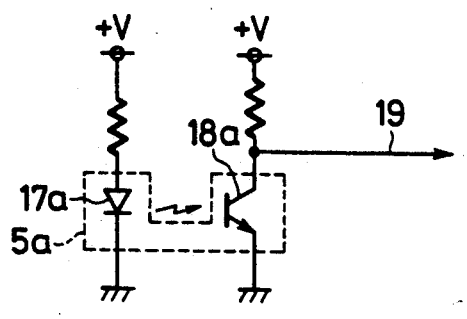
FIG. 7
| $20$ \ $19$ | LOW | HIGH |
|---|---|---|
| LOW | ROM | DRAW |
| HIGH | — | E-DRAW |
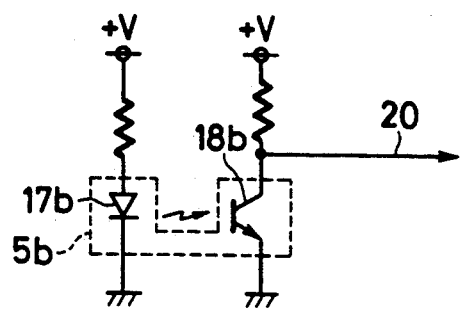

FIG. 19
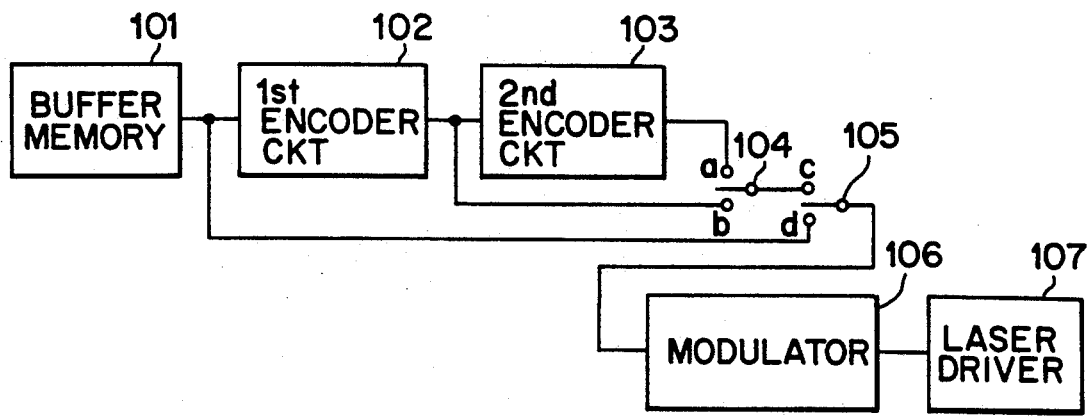
FIG. 20
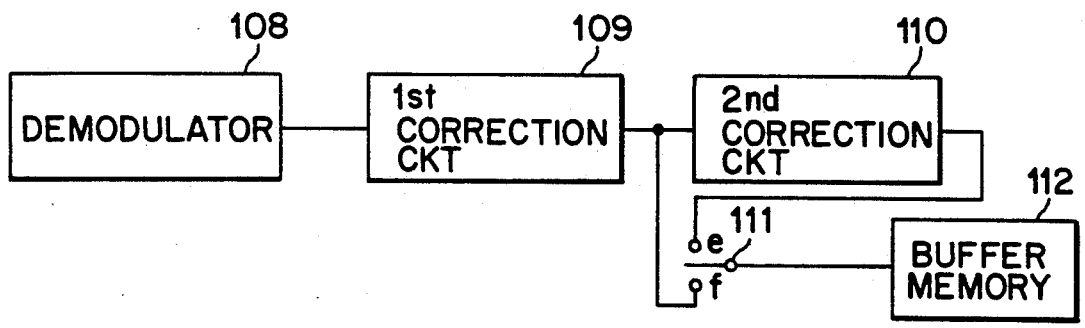
FIG. 21A
FIG. 21B

| DISK DIA.(cm) | 30 (D1) | 20 (D2) | 12 (D3) |
|---|---|---|---|
| INNERMOST TRACK DIA.(cm) | 15 | 10 | 6 |
| RECORD/REPRO-DUCTION RATE (bps) | 7.07M(CL1) | 4.7M(CL2) | 2.8M(CL3) |
| RECORD LASER POWER (ON DISK)(mW) | 7.5 (P1) | 5 (P2) | 3 (P3) |
| CIRCUIT SERVO GAIN RATIO | 133 (G1) | 200 (G2) | 330 (G3) |

OPTICAL INFORMATION RECORDING/REPRODUCTION APPARATUS INCLUDING MEANS FOR DETECTING THE TYPE OF RECORDING MEDIUM

This application is a continuation of application Ser. No. 07/634,086 filed Jan. 22, 1991, now abandoned, which is a continuation of application Ser. No. 07/122,647, filed Nov. 12, 1987, now abandoned, which is a continuation of application Ser. No. 06/802,717, filed Nov. 27, 1985, now abandoned.

BACKGROUND OF THE INVENTION

1. Field of the Invention

The present invention relates to an optical information storing apparatus which can handle different kinds of recording media.

2. Description of the Prior Art

As means for optically storing information, there have been known a writable optical disk of the DRAW type, a rewritable optical disk of the E-DRAW type, and an optical disk of the ROM type only for use of reproduction. For the DRAW type optical disk, the pits corresponding to the information to be stored are formed on the disk surface by a laser beam and the stored information is read out on the basis of a change in reflected light amount. For the E-DRAW type optical disk, flux reversal is caused on the disk surface due to the laser beam to record and erase information, and the recorded information is read out due to a magnetic Kerr effect or the like. For the ROM type disk, on one hand, the pits corresponding to information are preliminarily formed and the information signal is read out by use of a change in reflected light amount due to a laser beam.

Either one of those disks is selected in accordance with the purpose of information to be recorded. The ROM type disk is used in the case wherein information is preliminarily determined and mass production is needed and the disk must be preserved for a long time. The DRAW type disk is used in the case wherein the necessary number of disks is small and the disk must be preserved for a long time. The E-DRAW type disk is used in the case wherein there is a possibility such that the recorded information is erased later and the disk is used as a temporary buffer.

In this manner, the disks can be efficiently used. Even as for different kinds of disks, on the other hand, their fundamental constitutions for recording and reproducing information are substantially the same; therefore, it is desired to use a common driving apparatus.

In this case, however, depending on the kinds of disks, there are differences in reflection factor or transmission factor of the disk surfaces and in readout principle, so that the output level of the reproduced signal in the signal readout system, particularly, the information signal output component or the like changes by at least tens of times. In the case of reproducing information by the same reproducing system, there are problems such that an extensive dynamic range will be needed if the smaller reproduced signal is used as a reference, while noise will increase and the signal level will become too small for a small signal if the larger reproduced signal is used as a reference, and the like.

In addition, differences in reliability and error rate of the reproduced information signals occur dependent on the respective disks.

Namely, in the case of using the same error correction circuit for the respective disks, if the error correction circuit is constituted in accordance with the disk in which the error rate before correction is the highest, the over specification could be derived for the disk in which the error rate before correction is low. That is, since the error correction codes increase more than is needed for the information signal, the redundancy also increase more than is needed, resulting in poor coding efficiency.

A number of recording disks of various sizes (diameters) such as 30, 20, and 12 cm, or the like are used at present.

Those disks are used in accordance with the use object. The disk of a large size is used in the case of recording information of a large capacity. The recording disk of a small size is used in the case wherein easy handling property and portability of the recording disk are required.

Hitherto, the same recording/reproducing apparatus can use only one size of recording disk.

This is because of the following reasons. In the case of recording predetermined information in the recording disk using light, if the rotating speed of the recording disk is fixed to make constant the recording speed of the signal to be recorded, the diameter of this recording disk is proportional to the linear velocity, so that the length per unit (bit) of the information to be recorded is proportional to the diameter of the recording disk. Thus, the energy of light to be irradiated onto the unit area of the recording disk is inversely proportional to the diameter of the recording disk and the recording density in the disk is also inversely proportional to the diameter thereof.

Therefore, when the recording disk, having a diameter larger than that of the recording disk which is to be ordinarily used is used by the same optical information recording/reproducing apparatus, the light energy density on the recording disk is reduced, so that it can be difficult to properly record the information.

As described above, conventionally, only a single size of recording disk can be used in the same recording/reproducing apparatus. Therefore, in the case of using a plurality of recording disks of different sizes, there occurs a problem that a plurality of recording/reproducing apparatuses must be possessed corresponding to the sizes of the recording disks.

SUMMARY OF THE INVENTION

It is an object of the present invention to eliminate the foregoing drawbacks.

Another object of the invention is to improve an optical information recording/reproducing apparatus.

Still another object of the invention is to provide an optical information recording/reproducing apparatus which can stably record, reproduce, and erase information for different kinds of recording media.

Still another object of the invention is to provide an optical information recording/reproducing apparatus which can stably record, reproduce, and erase information for different sizes of recording media.

Still another object of the invention is to provide an optical information recording/reproducing apparatus which can detect the kind of recording medium.

Still another object of the invention is to provide an optical information recording/reproducing apparatus in which the stable recording, reproducing, and erasing operations can be performed for a plurality of kinds of recording media by the same apparatus by a simple constitution, without using any particular apparatus.

Still another object of the invention is to provide a high efficiency information filing apparatus which can satisfy both saving of resources (saving of space) and preservation (storage).

Still another object of the invention is to provide an optical information recording/reproducing apparatus in which in the case of reproducing different kinds of recording media using the same optical information recording/reproducing apparatus, even when using a certain kind of recording medium, as well, the output level in the signal readout system can be stabilized.

The above and other objects and features of the present invention will become apparent from the following detailed description and the appended claims with reference to the accompanying drawings.

BRIEF DESCRIPTION OF THE DRAWINGS

FIG. 4 is a diagram showing the identification of a disk;

FIG. 5 is a perspective view of another optical disk apparatus to which a method of the invention is applied;

FIG. 6 is a diagram showing examples of connection of photo interrupters in the apparatus shown in FIG. 5;

FIG. 7 is a diagram showing the identification of a disk;

FIG. 19 is a block diagram showing an example of an encoder for use in the invention;

FIG. 20 is a block diagram showing an example of a decoder for use in the invention;

FIG. 21A and 21B are signal formal diagrams for use in the invention;

DETAILED DESCRIPTION OF PREFERRED EMBODIMENTS

An embodiment of the present invention will be described in detail hereinbelow with reference to the drawings.

The case wherein an optical disk apparatus is used will be described as an embodiment of a recording medium identifying method according to the invention.

Figure 1:
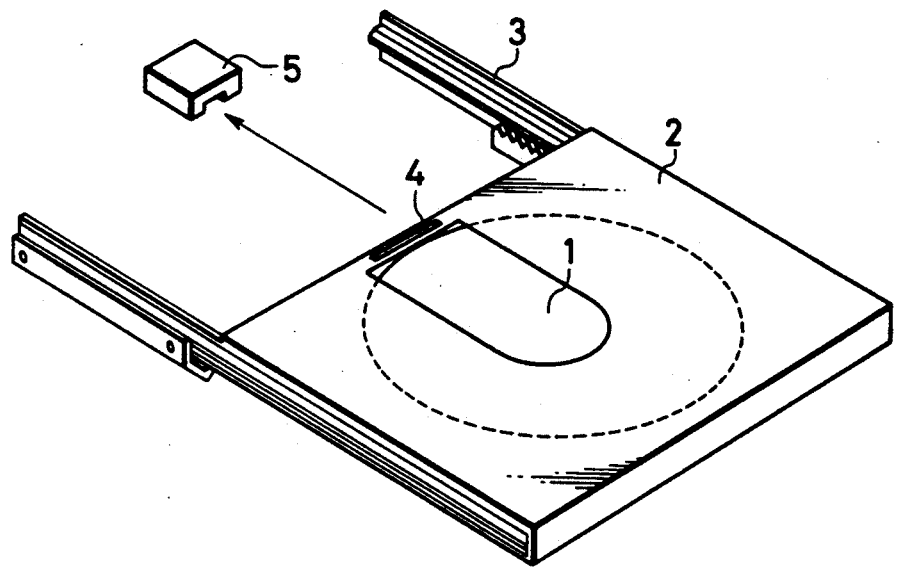
FIG. 1 is a perspective view of an optical disk apparatus to which a method according to the present invention is applied.

FIG. 1 is a perspective view of an optical disk apparatus to which the invention is applied. In FIG. 1, reference numeral 1 denotes a disk; 2 is a disk cartridge in which the disk 1 is inserted; 3 guide rails along which the disk cartridge 2 is inserted into a drive apparatus (not shown); and 4 is a reflecting seal applied on the disk cartridge 2. A reflection factor of the seal 4 may be changed in accordance with the kind of disk. For example, a reflecting seal of a reflection factor of 0% is applied for the ROM type disk. A reflecting seal of a reflection factor of 25% is applied for the DRAW type disk. A reflecting seal of a reflection factor of 50% is applied for the E-DRAW type disk. A photo interrupter 5 is provided.

Figure 2:
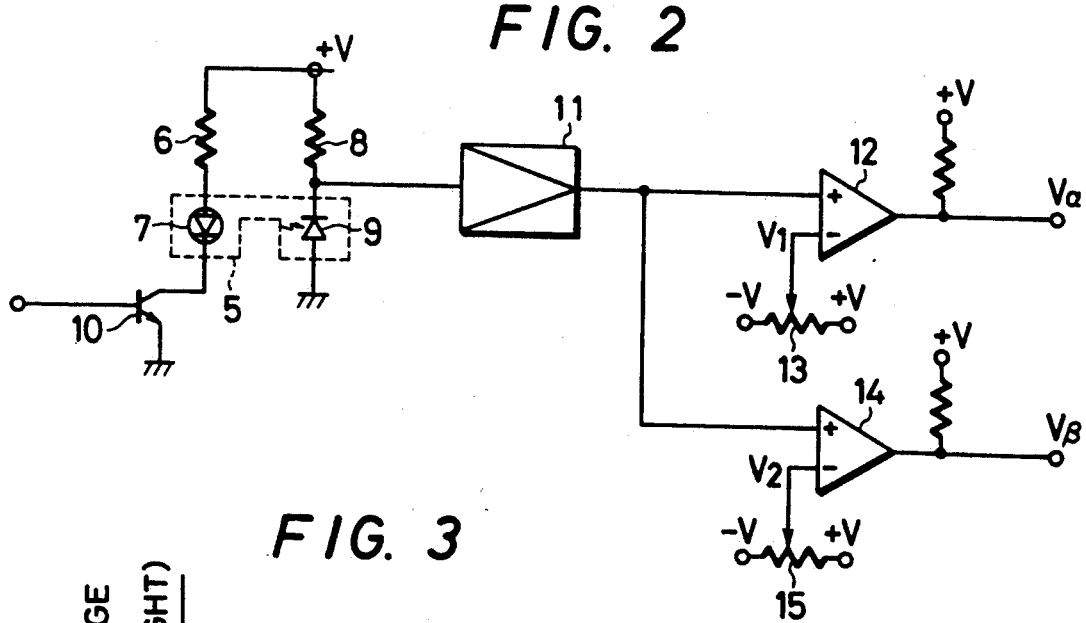
FIG. 2 is a circuit diagram of the optical disk apparatus shown in FIG. 1.

FIG. 2 is a circuit diagram of the optical disk apparatus shown in FIG. 1. In FIG. 2, reference numeral 7 denotes an LED; 6 is a current limiting resistor; 10 a transistor for driving the LED 7; 8 a bias resistor; 9 a pin photo diode; 11 a pre-amplifier for amplifying the signal received; 12 and 14 comparators; and 13 and 15 variable resistors.

The operation of the embodiment will be explained hereinbelow with reference to FIGS. 1 and 2.

Figure 3:
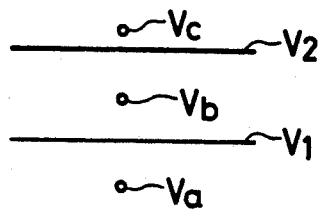
FIG. 3 is a diagram showing voltage values of a non-inverting input terminal and an inverting input terminal of a comparator in the circuit shown in FIG. 2.

When an input signal is inputted to a base of the transistor 10, this transistor is turned on, so that a current flows and the LED 7 emits light of a constant light amount. The light emitted from the LED 7 is reflected by the reflecting seal 4 and received by the pin photo diode 9. The signal which is outputted from the diode 9 is amplified and current-to-voltage converted by the pre-amplifier 11. Potentials of respective inverting input terminals (−) of the comparators 12 and 14 are set to $V_1$ and $V_2$ by the variable resistors 13 and 15. As shown in FIG. 3, the potential $V_1$ has a voltage value between an output value ($V_a$) from the pre-amplifier 11 in the case wherein the reflection factor of the reflecting seal is 0% and an output value ($V_b$) from the pre-amplifier 11 in the case wherein the reflection factor of the reflecting seal is 25%. The potential $V_2$ has a voltage value between the output value ($V_b$) and an output value ($V_c$) from the pre-amplifier 11 when the reflection factor of the reflecting seal is 50%. The comparators 12 and 14 compare the voltage values of the inverting input terminals (−) which were set as mentioned above with voltage values of non-inverting input terminals (+) connected to an output of the pre-amplifier 11. In the case of the ROM type disk on which the reflecting seal of the reflection factor of 0% is applied, there is the relation of $V_a < V_1 < V_2$. Therefore, both outputs of the comparators 12 and 14 become a low level. In the case of the DRAW type disk on which the reflecting seal of the reflection factor of 25% is applied, there is the relation of $V_1 < V_b < V_2$,; so that the output of the comparator 12 becomes a high level and the output of the comparator 14 becomes a low level. In the case of the E-DRAW type disk on which the reflecting seal of the reflection factor of 50% is applied, there is the relation of $V_1 < V_2 < V_c$, so that both outputs of the comparators 12 and 14 become a high level. As mentioned above, three kinds of output signals are generated as shown in FIG. 4, so that three kinds of different disks can be detected.

Another identifying method will then be explained.

FIG. 5 is a perspective view of another optical disk apparatus to which the invention is applied, in which the components having the same functions or constitutions as those in FIG. 1 are designated by the same reference numerals. In FIG. 5, light shielding plates 16a and 16b are attached to the cartridge 2. When the disk is inserted, the optical paths of photo interrupters 5a and 5b are interrupted by the plates 16a and 16b.

FIG. 6 shows examples of connection of the photo interrupters in the apparatus shown in FIG. 5. Reference numerals 17a and 17b denote LEDs; 18a and 18b are photo transistors; and 19 and 20 are output signals which are generated from the photo interrupters 5a and 5b, respectively.

First, in the case wherein the disk 1 enclosed in the disc cartridge 2 is of the ROM type, unless the light shielding plates 16a and 16b are attached to the cartridge 2, the lights emitted from the LEDs 17a and 17b of the photo interrupters 5a and 5b are not interrupted but are received by the photo transistors 18a and 18b when the cartridge is inserted, so that both control signals 19 and 20 become a low level.

In the case of the DRAW type disk, only the plate 16a is attached to the cartridge 2 and the plate 16b is not attached. With this arrangement, when the disk is inserted, the light from the LED 17a of the photo interrupter 5a is interrupted by the plate 16a, so that no light is received by the photo transistor 18a and the control signal 19 becomes a high level. The control signal 20 becomes a low level in a manner similar to the ROM type disk.

In the case of the E-DRAW type disk, both light shielding plates 16a and 16b are attached to the disk cartridge 2. With this arrangement, when the cartridge 2 is inserted, the light from the LEDs 17a and 17b of the photo interrupters 5a and 5b are interrupted and no light enters the photo transistors 18a and 18b, so that both control signals 19 and 20 become a high level. As described above, three kinds of output signals are generated as shown in FIG. 7 and three kinds of different disks can be detected.

The kind of disk may be detected by forming the concave portions in place of the light shielding plates.

Still another identifying method will be explained.

Figure 8:
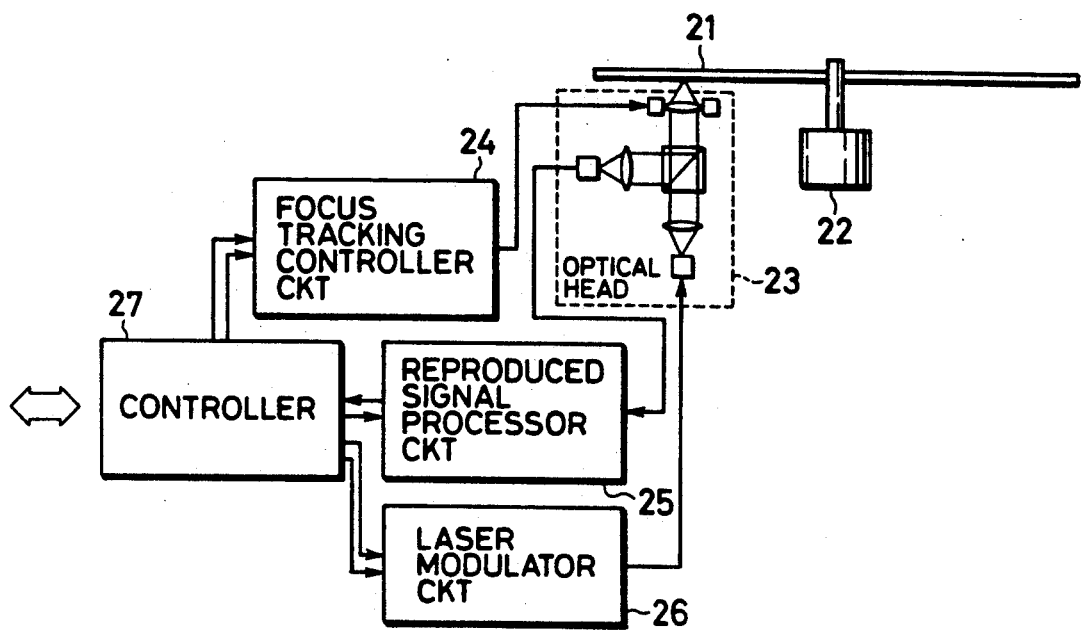
FIG. 8 is a block diagram showing an embodiment of the present invention.

FIG. 8 is a block diagram showing an embodiment of the invention.

A recording medium 21 can be loaded from the outside. A spindle motor 22 rotates the recording medium 21. An optical head 23 records data in the medium 21 or reproduces data therefrom. A focus tracking controller circuit 24 executes auto-focusing and auto-tracking operations of a light beam.

A reproduced signal processor circuit 25 amplifies the signal reproduced from the recording medium 21 and demodulates it. A controller 27 sets gains of the controller circuit 24 and processor circuit 25, respectively.

A laser modulator circuit 26 modulates a laser beam which is used to record data in the recording medium 21. An output value of the laser beam can be set by the controller 27.

Figure 9:
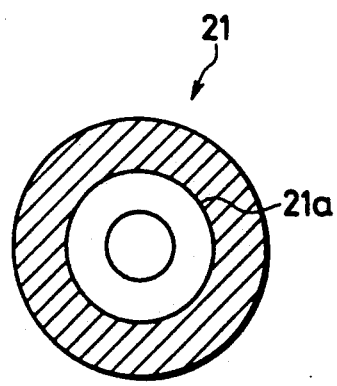
FIG. 9 is a diagram showing an example of recording media for use in the above embodiment.

FIG. 9 is a diagram showing a recording medium for use in the optical information recording/reproducing apparatus.

Information is recorded and reproduced in and from the hatched area of the recording medium 21. A code information indicative of the kind of recording medium 21 is recorded in an innermost track 21a of the medium 21.

In the process of forming the pre-group on the recording medium 21, the identification information is recorded as a pit on this pre-group by physically forming a hole in the medium 21. By recording the medium identification information when the recording medium is produced, this identification information can be detected when the recording medium is used and the recording/reproducing conditions can be properly set in accordance with the result of this detection. Thus, the optimum recording and reproducing operations can always be executed in accordance with the kind of recording medium to be used. Namely, when recording medium 21 is used, the medium identification information recorded on the pre-group is first read to identify this information, thereby setting each circuit so as to become suitable for this recording medium.

The operation of the above embodiment will now be described.

Figure 10:
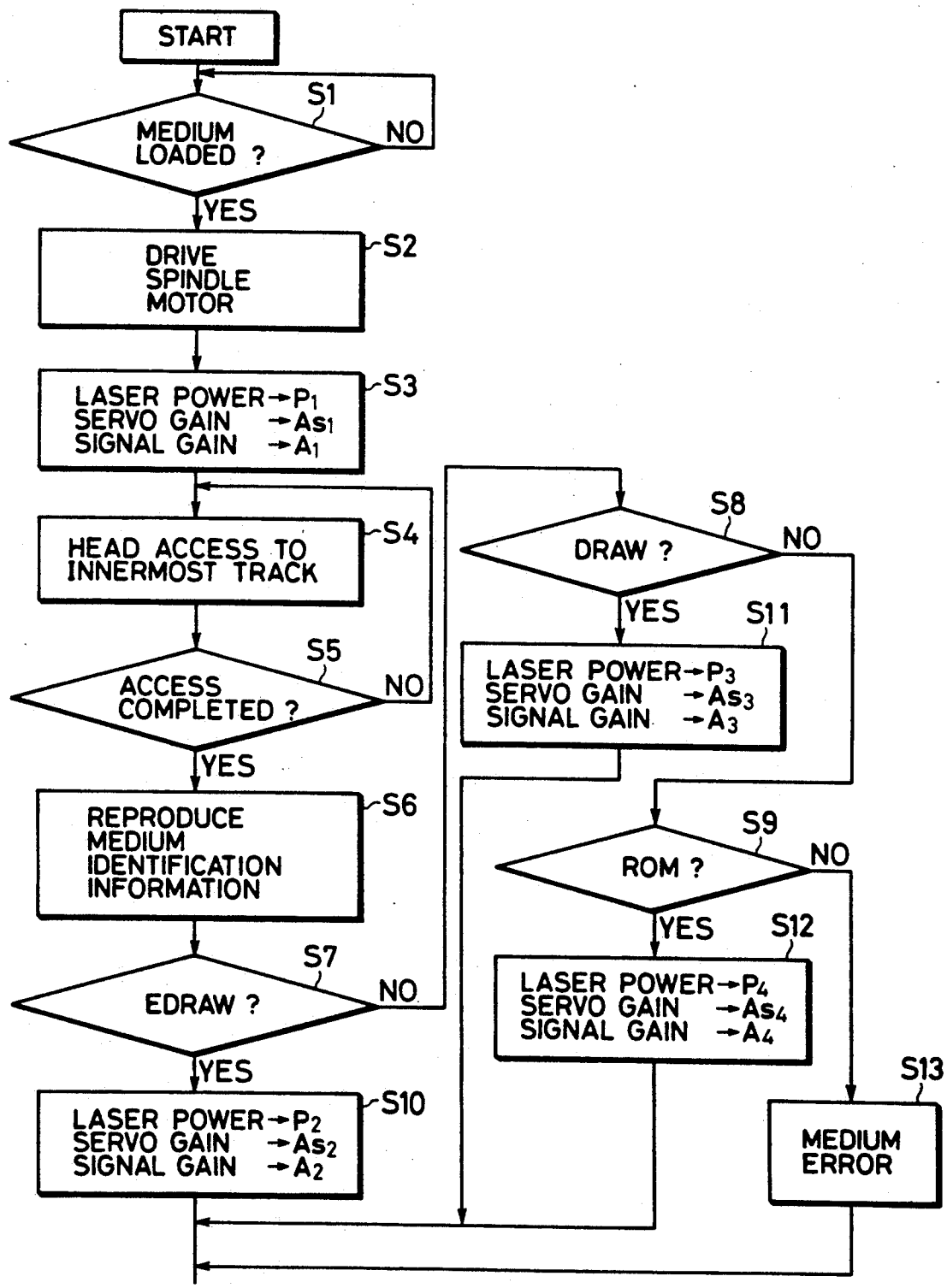
FIG. 10 is a flowchart showing the operation of the above embodiment.

FIG. 10 is a flowchart showing the procedure to discriminate the kind of recording medium by the controller 27.

The controller 27 always checks whether or not the recording medium 21 has been loaded in the apparatus (step 1). If YES, the spindle motor 22 starts rotating (step 2) to rotate the medium at a predetermined speed. A laser power, a servo gain, and a signal gain are set to predetermined values so that the sort identification information of the medium 21 recorded on the pregroup can be reproduced (step 3). At the same time, the optical head 23 is accessed to the innermost track 21a in the recording/reproducing area (step 4). The sort identification information is recorded in the track 21a.

After completion of the access, the sort identification information of the medium 21 is reproduced (steps 5 and 6) and the reproduced signal is sent to the controller 27 through the reproduced signal processor circuit 25.

The controller 27 discriminates whether the medium 21 is of the E-DRAW, DRAW, or ROM type (steps 7, 8, 9) on the basis of the code data derived from the reproduced signal. Then, the laser power, servo gain, and signal gain which are optimum for the recording medium discriminated are set (steps 10, 11, 12). If the recording medium does not correspond to any of those three types, the subsequent processes are stopped.

Still another identifying method will be described.

The case wherein a discriminating area consisting of a reflector is provided for the disk will be explained in this example.

Figure 11:
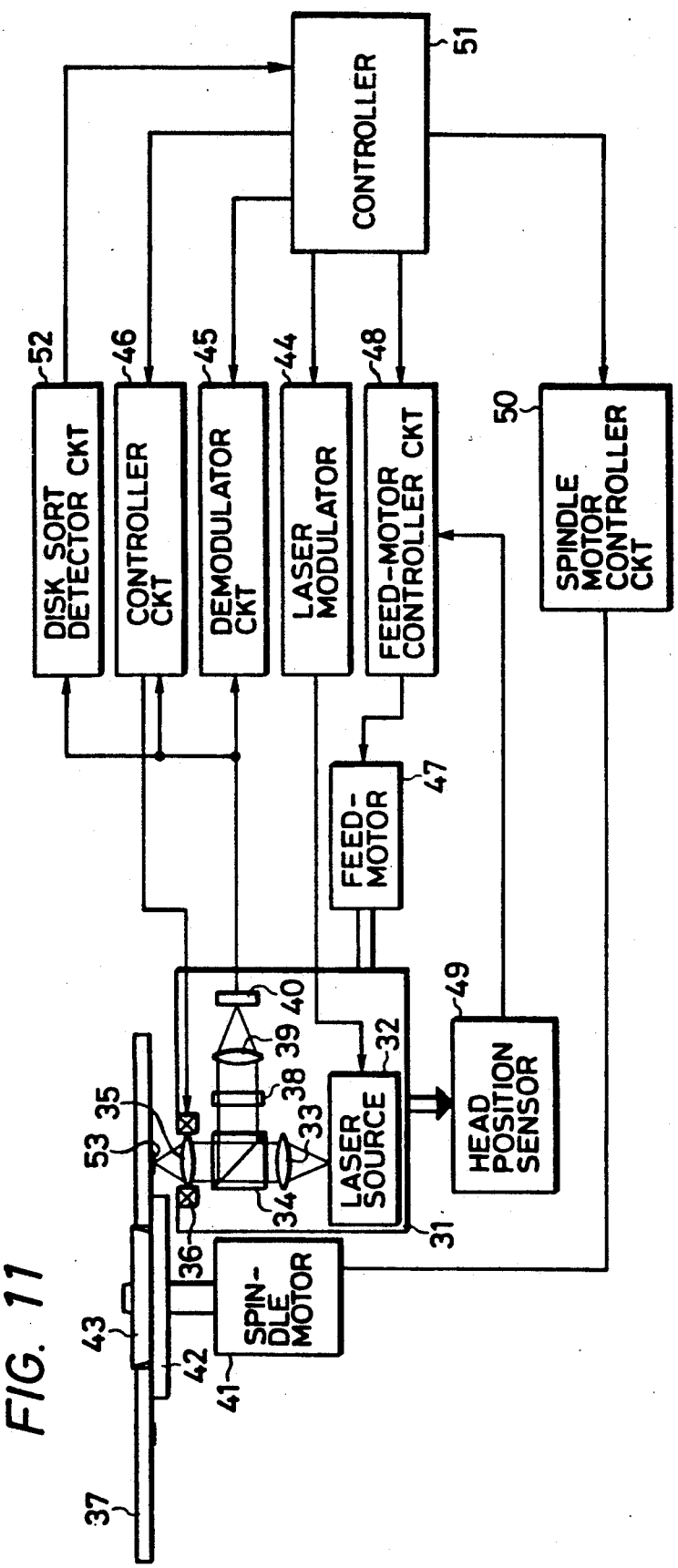
FIG. 11 is an arrangement diagram of an embodiment of an optical information recording/reproducing apparatus according to the present invention.

FIG. 11 is an arrangement diagram of an embodiment of an optical information recording/reproducing apparatus according to the invention. In FIG. 11, reference numeral 31 denotes an optical head; 32 is a laser source; 33 a collimator lens for parallelizing a laser beam from the laser source 32; 34 a deflection beam splitter for reflecting the reflected light from a disk 37; 35 an objective lens; and 36 an actuator for driving the objective lens 35 to allow the laser beam passing through the objective lens to focus and track at a predetermined position on the surface of the disk 37. Reference numeral 38 denotes an analyzer; 39 a condenser lens; 40 a photo sensitive device; and 41 a spindle motor for rotating the disk 37 loaded on a turntable 42 by a clamp 43. In a recording operation, an image information signal is converted to a photo signal by the laser source 32 by the laser modulator 44. The laser beam passes through the collimator lens 33, deflection beam splitter 34, and objective lens 35 and is focused on the disk 37 and recorded therein. In a reproducing operation, a laser beam of a constant power is generated from the laser source 32 and irradiated onto the disk 37 in a manner similar to the above-mentioned recording process. The laser beam reflected by the disk 37 passes through the objective lens 35, deflection beam splitter 34, analyzer 38, and condenser lens 39 and enters the photo sensitive device 40. The reflected light amount is converted to an electrical signal by the device 40 and reproduced as image information by a demodulator circuit 45. At the same time, the output from the device 40 is also transmitted to a focusing/tracking controller circuit 46 and drives the objective lens 35 by the actuator 36, thereby performing the focusing and tracking controls. In the case of the E-DRAW type disk, for the erasing operation, a laser beam of a constant power is generated from the laser source and irradiated onto the disk 37 in a manner similar to the foregoing recording operation, thereby erasing the information recorded in the disk 37. The optical head 31 is accessed in the radial direction of the disk by a feed motor 47. A controller circuit 48 of the feed motor 47 controls the position of the optical head 31 in accordance with an output of a head position sensor 49. A spindle motor controller circuit 50 rotates the spindle motor 41 at a rotating speed in accordance with the type of disk which is indicated by a controller 51 to which a signal representative of the type of disk is sent from a disk sort detector circuit 52. The controller 51 controls the timings for the above-mentioned circuits.

Figure 12:
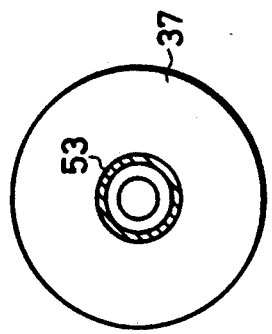
FIG. 12 is a plan view of a disk for use in an optical information recording/reproducing apparatus according to the invention.
Figure 13:
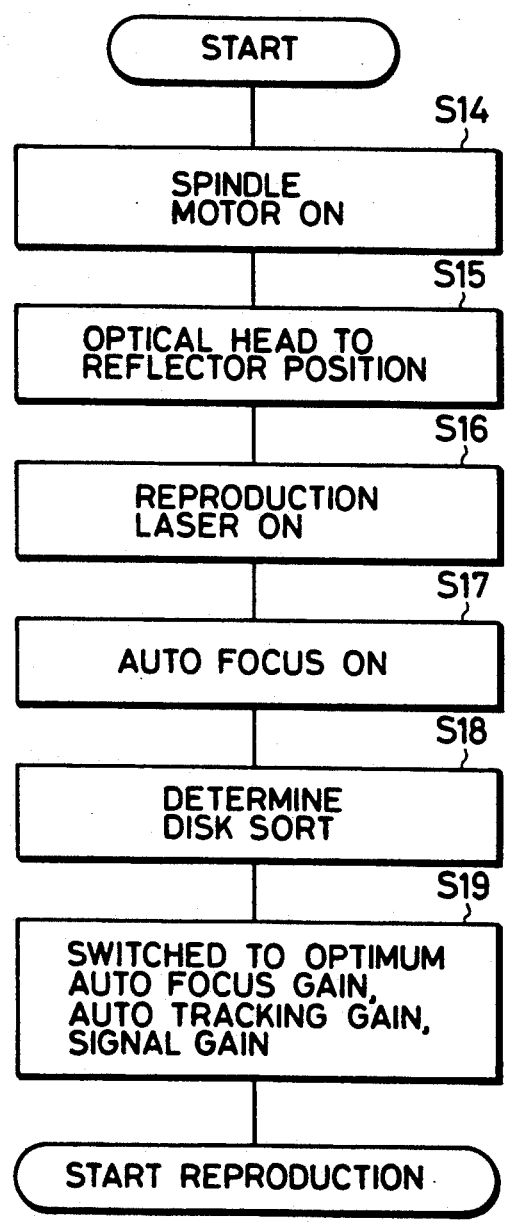
FIG. 13 is an operation flowchart for discriminating the kind of disk.

FIG. 12 is a plan view of the disk which is used in the optical information recording/reproducing apparatus according to the invention. Numeral 37 denotes the disk and a discriminating area 53 consisting of a reflector is provided on the disk surface. A reflection factor of this reflector may be changed in accordance with the kind of disk. For example, the reflection factor is set to 0% in the case of the ROM type disk; 25% in the case of the DRAW type disk; and 50% in the case of the E-DRAW type disk.

The discriminating operation will be described with reference to an operation flowchart to discriminate the kind of disk shown in FIG. 12.

First, the disk 37 is put on the turntable 42 and the power supply is turned on for initialization of the apparatus, so that the spindle motor 41 with the disk 37 loaded thereon starts rotating (step 14). The feed motor controller circuit 48 then drives the feed motor 47 in response to the instruction from the controller 51 to access so that the optical axis of the objective lens 35 of the optical head 31 approaches the discriminating area 53 (step 15). Thereafter, the laser source 32 is turned on (step 16) and the auto-focus servo loop is closed to execute the auto-focusing operation (step 17). It is now assumed that the reflection factor of the reflector affixed on the disk is set to a value within such a range that the auto-focusing operation can be performed. The laser beam generated from the laser source 32 passes through the collimator lens 33, deflection beam splitter 34, and objective lens 35 and is irradiated onto the reflector 53 on the disk 37. The laser beam reflected by the reflector passes through the objective lens 35, splitter 34, analyzer 38, and condenser lens 39 and enters the photo sensitive device 40. The reflected light amount is converted to an electrical signal by the device 40. The type of disk is then discriminated by the disk sort detector circuit 52 (step 18). In accordance with control signals from the controller 51, the laser modulator 44 and spindle motor controller circuit 50 adjust the laser power and rotating speed to the optimum values for the disk placed on the turntable 42, respectively. At the same time, the controller 51 sends control signals to the focusing/tracking controller circuit 46 and demodulator circuit 45, thereby switching the auto-focus gain, auto-tracking gain, and signal gain to the optimum values (step 19). Then, the optical head 31 is moved and the reproduction is started.

Figure 14:
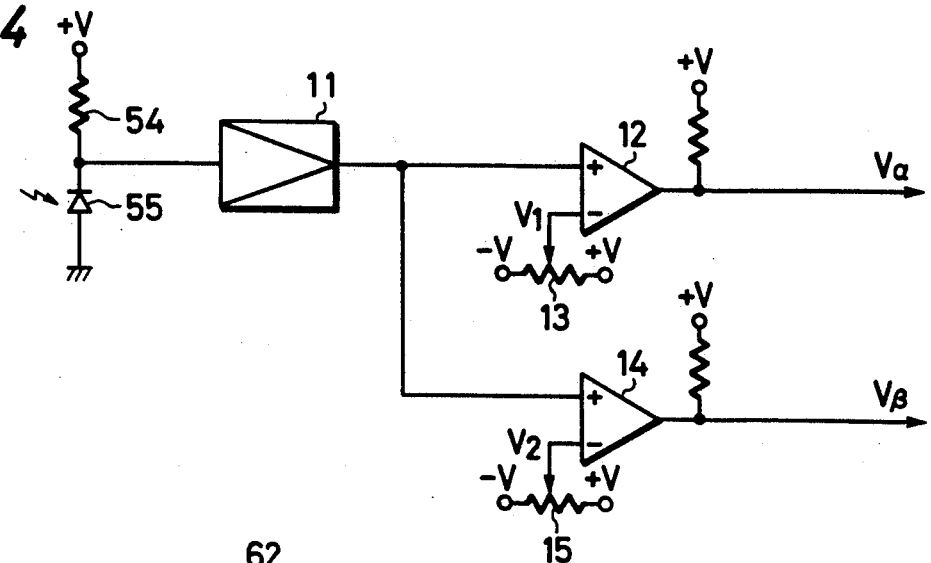
FIG. 14 is a circuit diagram showing a disk sort detector in one embodiment.

FIG. 14 is a circuit diagram of the disk sort detector circuit in the embodiment, in which components having the same functions or constitutions as those shown in FIG. 2 are designated by the same reference numerals. In FIG. 14, reference numeral 54 denotes a bias resistor and 55 is a pin photo diode to receive the reflected light from a reflecting material. Since the identifying method in practice is substantially the same as that in FIG. 2, its description is omitted. In the apparatus using a transmission type disk in which information is reproduced by a transmitted light, a similar operation can be performed by providing the discriminating area consisting of a transmission material whose transmission factor differs depending on the type of disk surface.

Change of each control parameter will be described by use of the foregoing disk identifying method.

Figure 15:
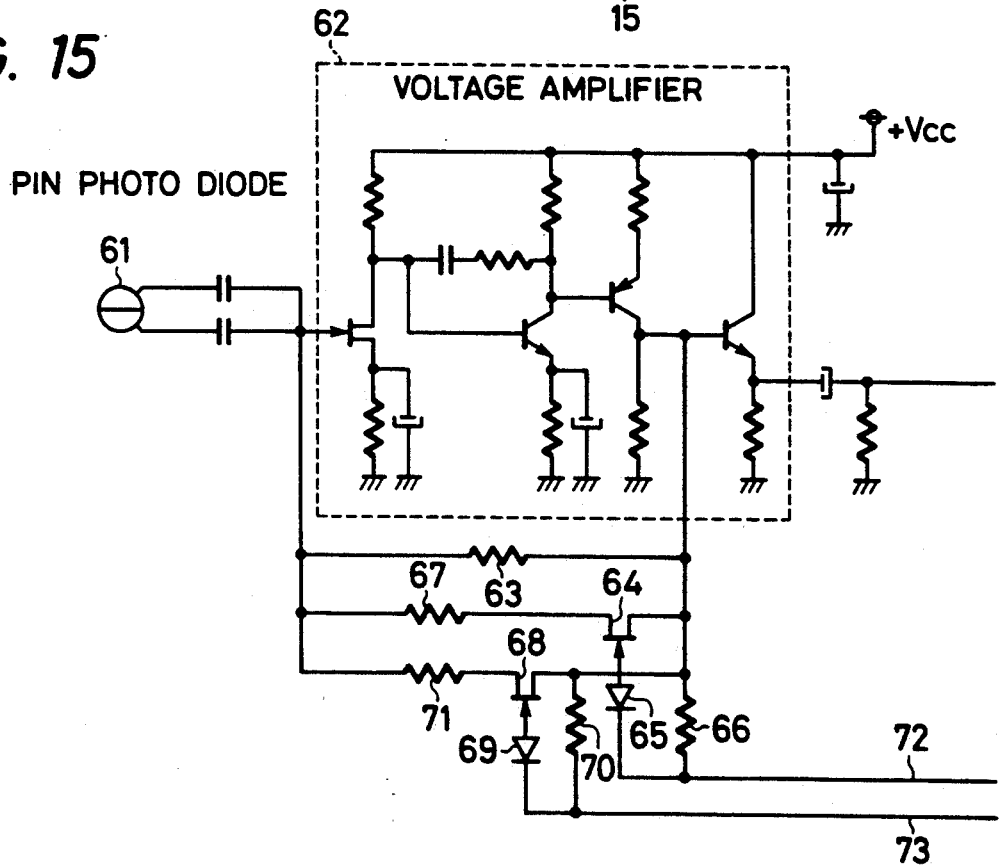
FIG. 15 is a circuit diagram showing an embodiment of the invention.

FIG. 15 is a circuit diagram showing an embodiment of the invention.

A pin photo diode 61 is included in an optical pickup and is a photoelectric converting device for converting light amount information which varies dependent on individual information recorded on the disk to current information. A voltage amplifier 62 is an example of the signal readout system and converts the information signal current to a voltage. A feedback resistor 63 reduces a gain of the voltage amplifier. A first analog switch 64 is used to connect between an input and an output of the voltage amplifier 62 through a second feedback resistor 67 and is constituted by an FET (field effect transistor). A second analog switch 68 is used to connect between the input and the output of the voltage amplifier 62 through a third feedback resistor 71 and is constituted by an FET as well. The feedback resistors 63, 67, and 71 are mutually equivalently connected in parallel. In addition, resistors 66 and 70 and diodes 65 and 69 are provided.

Further, a control signal 72 for the first analog switch is supplied to the first analog switch 64. A control signal 73 for the second analog switch is supplied to the second analog switch 68.

It is now assumed that the type of disk is identified in a manner such that both control signals 72 and 73 become a low level when the E-DRAW type disk is loaded in the apparatus, the control signal 72 becomes a high level and the control signal 73 becomes a low level when the DRAW type disk is loaded, and both control signals 72 and 73 become a high level in the case of the ROM type disk.

When the E-DRAW type disk is loaded, both control signals 72 and 73 become a low level, so that both analog switches 64 and 68 are turned off and only the feedback resistor 63 is made conductive.

When the DRAW type disk is loaded, the control signal 72 becomes a high level and the control signal 73 becomes a low level, so that the first analog switch 64 is turned on to make the second feedback resistor 67 conductive. However, since the second analog switch 68 is turned off, the third feedback resistor 71 is made non-conductive. Therefore, both feedback resistors 63 and 67 are made conductive and the feedback resistance value is smaller than that in the case wherein the optical magnetic disk was inserted, so that the gain of the signal readout system is reduced.

When the ROM type disk is loaded, both control signals 72 and 73 become a high level, so that both analog switches 64 and 68 are turned on to make the second and third feedback resistors 67 and 71 conductive. Thus, the synthesized resistance value of the feedback resistors decreases and the gain of the signal readout system is further reduced.

Figure 16:
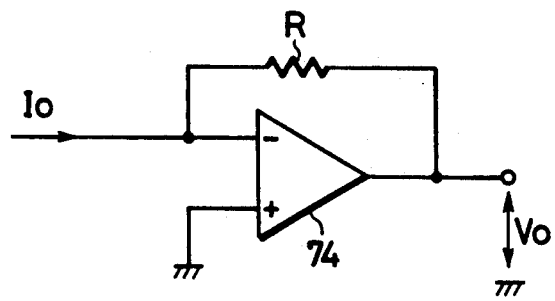
FIG. 16 is an explanatory diagram in the case of performing current-to-voltage conversion.

FIG. 16 is an explanatory diagram in the case of performing the current-to-voltage conversion.

An operational amplifier 74 in FIG. 16 corresponds to the voltage amplifier 62 shown in FIG. 15. In FIG. 16, when a current $I_O$ is supplied, an output voltage $V_O$ is expressed as follows.

$$V_O = -A \cdot I_O R/(1+A)$$

where, A is a gain of the operational amplifier 74. It will be appreciated from this expression that when the input current changes, by changing a value of a feedback resistor R, its output voltage can be held constant.

Generally, a value of the reproduced signal current in the pin photo diode 61 sequentially increases in accordance with the order of the optical magnetic disk, optical disk, and ROM type disk. In the foregoing embodiment, the gain of the signal readout system sequentially decreases in accordance with the order of the optical magnetic disk, optical disk, and ROM type disk. Therefore, in this embodiment, even when any one of the optical magnetic disk, optical disk, and ROM type disk is used, the output level of the signal readout system always becomes a constant value.

The foregoing embodiment intends to stabilize the output level of the signal readout system by changing the feedback resistors of the voltage amplifier 62 for converting a current value to a voltage value in accordance with the kind of disk. On one hand, in the case wherein there is an allowance of the dynamic range of the voltage amplifier 62, the output voltage is divided by a resistor and a value of the dividing resistor in this case may be varied in accordance with the kind of disk. With this arrangement, the output voltage can be stabilized irrespective of the kind of disk.

The case wherein the rotating speed of the disk is changed in accordance with the kind of disk will now be described.

Figure 17:
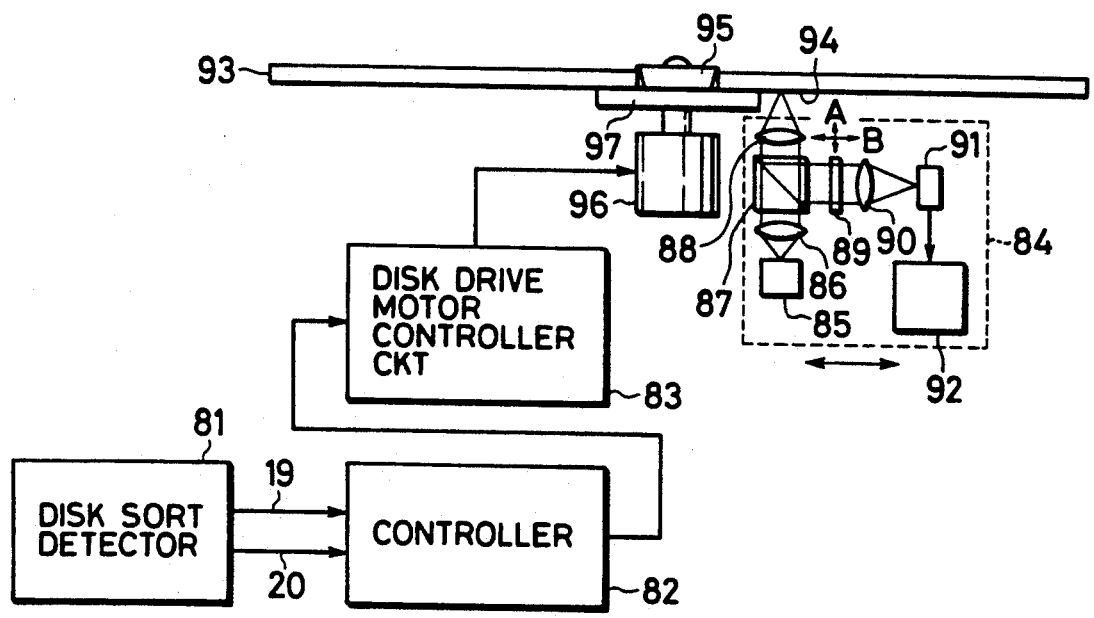
FIG. 17 is a schematic diagram of an embodiment of an optical information recording/reproducing apparatus according to the invention.

FIG. 17 is an arrangement diagram of an embodiment of an optical information recording/reproducing apparatus according to the invention. In FIG. 17, an optical head 84 is accessed in the radial direction of a disk 93. Reference numeral 85 denotes a laser source; 86 a collimator lens for parallelizing a laser beam from the laser source; 87 a beam splitter for reflecting the reflected light from the disk 93; and 88 an objective lens provided so as to be movable in both the vertical direction indicated by arrows A to perform the focus control of the laser beam when the recording, reproducing, and erasing operations are performed for the discoidal disk 93 and the horizontal direction indicated by arrows B to execute the tracking control of the laser beam. In the recording operation, a laser beam is generated from the laser source 85 which is controlled by a laser modulator (not shown) and this laser beam passes through the collimator lens 86, beam splitter 87, and objective lens 88 and is irradiated onto the disk 93, so that the recording is performed. In the reproducing operation, a laser beam of constant power is generated from the laser source 85 and irradiated onto the disk 93 in a manner similar to the recording process. The laser beam reflected by the disk 93 passes through the objective lens 88, beam splitter 87, an analyzer 89, and a condenser lens 90 and enters a photo sensitive device 91. A reflected light amount is converted to an electrical signal by the device 91. This electrical signal is sent to a signal processor 92, so that the signal is reproduced. In the erasing operation, a laser beam of constant power is generated from the laser source 85. This laser beam passes through the collimator lens 86, beam splitter 87, and objective lens 88 and is irradiated onto the disk 93, so that the information recorded in the disk 93 is erased.

A signal indicative of the kind of disk is sent to a controller 82 from a disk sort detector 81. The controller 82 then outputs a signal indicative of the rotating speed of the disk according to the kind of disk to a disk drive motor controller circuit 83, thereby controlling the rotating speed of the disk 93. The disk 93 is loaded on a turntable 97 by a clamp 95 and is rotated by a disk drive motor 96 connected to the controller circuit 83.

Although either one of the above-mentioned disk sort identifying methods is used in the disk sort detector 81, any other method may be used. For this example, however, it is assumed that the method of FIG. 5 is used. In the case of the ROM type disk, both control signals 19 and 20 (see FIG. 6) which are outputted to the controller 82 from the detector 81 become a low level. For the DRAW type disk, the signal 19 becomes a high level and the signal 20 becomes a low level. In the case of the E-DRAW type disk, both signals 19 and 20 become a high level.

As described above, three kinds of control signals can be outputted.

Figure 18:
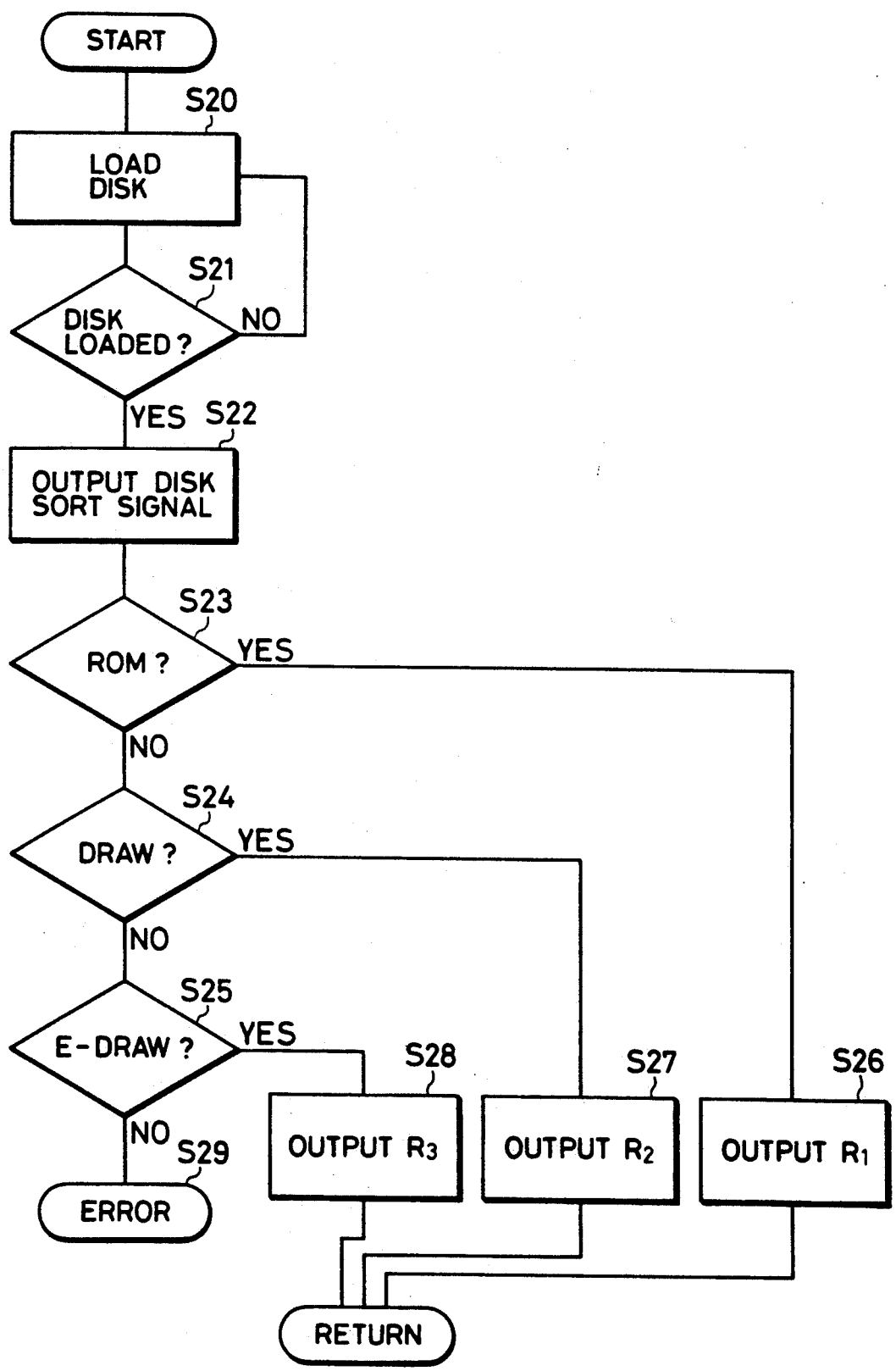
FIG. 18 is an operation flowchart of an optical information recording/reproducing apparatus according to the invention.

FIG. 18 shows an operation flowchart for the optical information recording/reproducing apparatus according to the invention.

This operation is started when the disk is replaced and the power supply of the disk apparatus is turned on. First, the disk is loaded (step 20) and a check is made to see if the disk has completely been loaded or not (step 21). If YES, the kind of disk is detected by the disk sort detector 81 and control signals 19 and 20 are outputted (step 22). Thereafter, a check is made by the control signals 19 and 20 to see if the disk is of the ROM type or not (step 23). In the case of the ROM type disk, namely, when both control signals 19 and 20 are at a low level, a signal indicative of a rotating speed $R_1$ corresponding to this disk is outputted from the controller 82 to the disk drive motor controller circuit 83 (step 26). If the disk is not the ROM type, a check is made to see if it is of the DRAW type or not (step 24). In the case of the DRAW type disk, namely, when the control signal 19 is at a high level and the signal 20 is at a low level, a signal representative of a rotating speed $R_2$ corresponding to the DRAW type disk is outputted (step 27). If the disk is neither the ROM type, nor the DRAW type, a check is made to see if the disk is of the E-DRAW type or not (step 25). In the case of the E-DRAW type disk, namely, when both control signals 19 and 20 are at a high level, a signal indicating a rotating speed $R_3$ corresponding to the E-DRAW type disk is outputted (step 28). When the disk is none of the ROM type, DRAW type, and E-DRAW type, it is determined that an error has occurred (step 29) and the error indication is displayed, or the like. Practical examples of the rotating speeds in the reproducing, recording, and erasing operations of the ROM type disk, DRAW type disk, and E-DRAW type disk are shown in table 1.

TABLE 1

|  | Reproduction | Recording | Erasing |
|---|---|---|---|
| ROM type ($R_1$) (rpm) | 1,800 | — | — |
| DRAW type ($R_2$) (rpm) | 1,200 | 700 | — |
| E-DRAW type ($R_3$) (rpm) | 900 | 900 | 700 |
| Laser power on the disk (mW) | 2.0 | 7.0 | 7.0 |

The disk drive motor controller circuit 83 switches the rotating speed by, for example, switching a quartz resonator of a reference clock oscillator, switching a frequency dividing circuit, or the like in response to a signal from the controller 82.

The case where the capability of an error correction circuit is changed in accordance with the kind of disk will now be explained.

FIG. 19 is a block diagram showing encoders in an embodiment of the invention.

In FIG. 19, there are provided: a buffer memory 101 for temporarily storing an information signal; a first encoder circuit 102 for producing a first error correction code; a second encoder circuit 103 for producing a second error correction code; a first switch 104 for switching between the first and second encoder circuits 102 and 103; a second switch 105 for switching between an output from the buffer memory 101 and an output from the first or second encoder circuit 102 or 103; a modulator 106 for modulat-ing the signal from the buffer memory 101 and the signal from the encoder circuit 102 or 103 switched by the switches 104 and 105; and a laser driver 107 for driving a laser beam (not shown) on the basis of the modulated information signal and recording the information on the disk.

FIG. 20 is a block diagram showing a decoder in an embodiment of the invention.

In FIG. 20, there are provided a demodulator 108, a first error correction circuit 109, a second error correction circuit 110, a switch 111, and a buffer memory 112.

The operation of this embodiment will now be described. In this case, it is assumed that the disk sort identifying method shown in FIGS. 5 and 6 is used.

Explanation will now be made with respect to two disks having different characteristics.

First, in the case wherein the disk in which an error rate of original information is high (for example, the optical magnetic disk) is used, the first switch 104 is controlled by the control signals 19 and 20 (see FIG. 6) and switched to side a.

The data is sent from the buffer memory 101 to the modulator 106 and first encoder circuit 102 at a constant bit rate for the period $T_3$ shown in FIG. 21. In this case, the second switch 105 is connected to side d. After an expiration of the period $T_3$, the switch 105 is connected to side c and error correction codes $P_2$ and $P_1$ are sent to the modulator 106 from the second encoder circuit 103.

The above-mentioned data and error correction codes $P_2$ and $P_1$ are repeatedly transmitted, in other words, a pattern shown in FIG. 21(B) is repeated, thereby recording predetermined information on the disk.

On the other hand, when the disk in which an error rate of original information is low (e.g., optical disk) is used, the switch 104 is connected to side b. The data is inputted to the modulator 106 and first encoder circuit 102 for a period $T_2$ and the data can be outputted to the modulator 106 through the switch 105 without passing through the second encoder circuit 103. After an elapse of the period $T_2$, the switch 105 is switched to side c and the data and error correction code $P_1$ are repeatedly inputted to the modulator 106 in accordance with a pattern shown in FIG. 21(A), so that this information is recorded on the disk. In the reproducing operation, in the case wherein an error rate of original information is low, the switch 111 is connected to side f by the control signals 19 and 20 and the signal demodulated by the demodulator 108 is subjected to error correction by the first error correction circuit 109 in accordance with a format of FIG. 21(A).

On the contrary, when an error rate of original information is high, the switch 111 is switched to side e and the error correction including the second error correction code $P_2$ also is first performed by the first error correction circuit 109. In the next stage, the correction is again carried out by the second error correction circuit 110 on the basis of the format of FIG. 21(B) with respect to the data area, so that the correction is performed more completely. The corrected information signal is sent to the buffer memory 112 for the reproduced signal output apparatus at the next stage.

The case of changing control parameters in accordance with the size of disk will now be described.

Figures 22, 23:
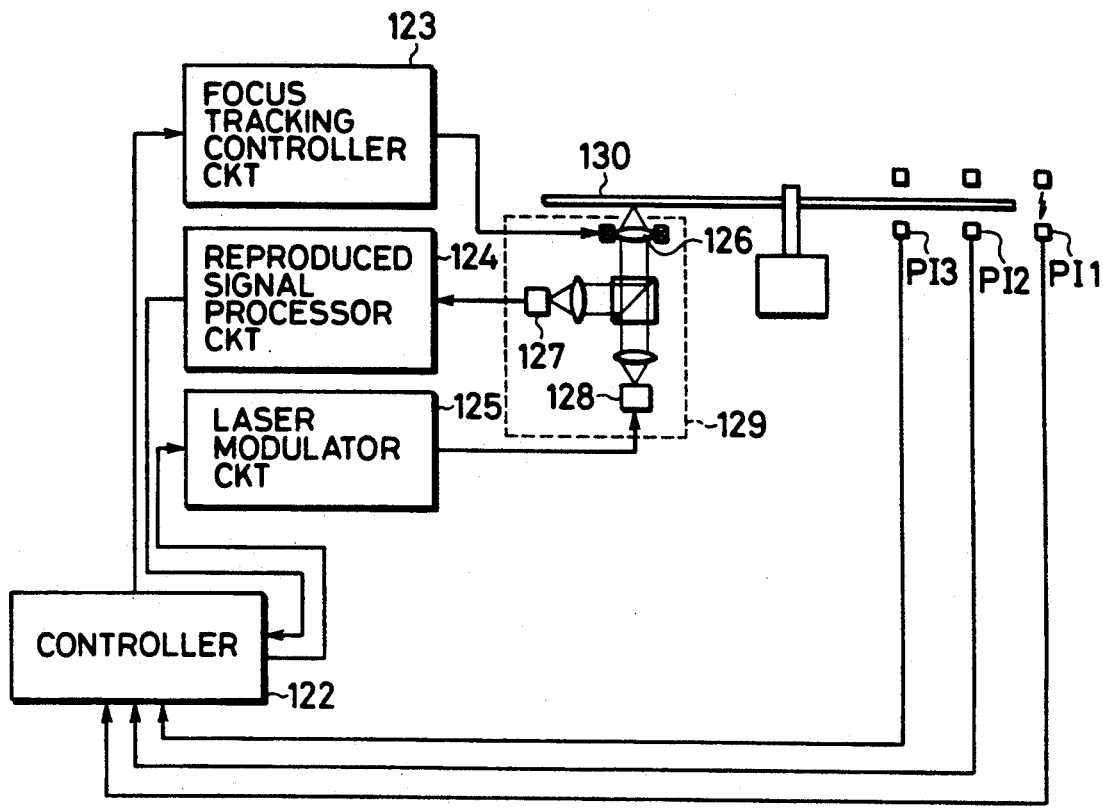
FIG. 22 is a block diagram showing an embodiment of the invention.
FIG. 23 is a table showing various constants in the case wherein the size of recording disk is changed.

FIG. 22 is a block diagram showing an embodiment of the present invention.

A photo interrupter $PI_3$ detects whether a recording disk 130 has been loaded or not. The optical path of this interrupter is interrupted as well for the recording disk of minimum size. Photo interrupters $PI_2$ and $PI_1$ detect the size (diameter) of the recording disk 130 and are similar to those which are used in conventional audio record players.

A controller 122 controls a laser power (power of the light) and a gain of a focus tracking controller circuit 123 in accordance with the disk size detected by the photo interrupters $PI_1$ to $PI_3$.

The focus tracking control circuit 123 controls the focus and tracking.

The reflected light from the recording disk 130 is detected by a photo sensor 127 and a current corresponding to the reflected light is outputted from the photo sensor 127. This current is converted to a voltage and amplified and demodulated by a reproduced signal processor circuit 124. On one hand, signals corresponding to the focusing and tracking deviations of the reproduced signal are sent to the focus tracking controller circuit 123.

A laser modulator circuit 125 changes the laser power upon recording in response to an instruction from the controller 122.

An optical head 129 focuses a laser beam from a laser source 128 onto the recording disk 130 by way of an objective lens 126. The reflected light from the recording disk 130 is received by the photo sensor 127.

The operation of this embodiment will now be described.

An example of the case wherein the rotating speed is held constant for the recording disks of different diameters will be explained. The apparatus is set to the conditions suitable for recording with respect to three kinds of recording disks having the same sensitivity and different sizes (for instance, the recording disks of diameters of 30, 20, and 12 cm), respectively.

Those conditions are determined so as to optimize the record/reproduction rate of information, the laser power, and the gain of the focus tracking controller circuit. The optimization of the record/reproduction rate is necessary to obtain the optimum recording density. The optimization of the laser power is needed to derive the optimum recording power.

By detecting the photo signal, on one hand, the focus tracking control is performed. Therefore, as the laser power changes, the levels of the difference signals to detect the focus state and tracking state also vary, so that the gain of the focus tracking controller circuit is needed to be optimized.

Further, for the above recording disks of three kinds of sizes, the case wherein the recording area exists from the position which is five millimeters inside of the end (or outer periphery) of the recording disk 130 to the position corresponding to half of the radius of the disk 130 will be explained, as an example.

FIG. 23 is a table showing various constants when the size of recording disk is changed.

In FIG. 23, it is assumed that the rotating speed of the recording disk 130 is 900 rpm and the minimum length of one bit (minimum unit of the information) is 1 $\mu$m.

Figure 24:
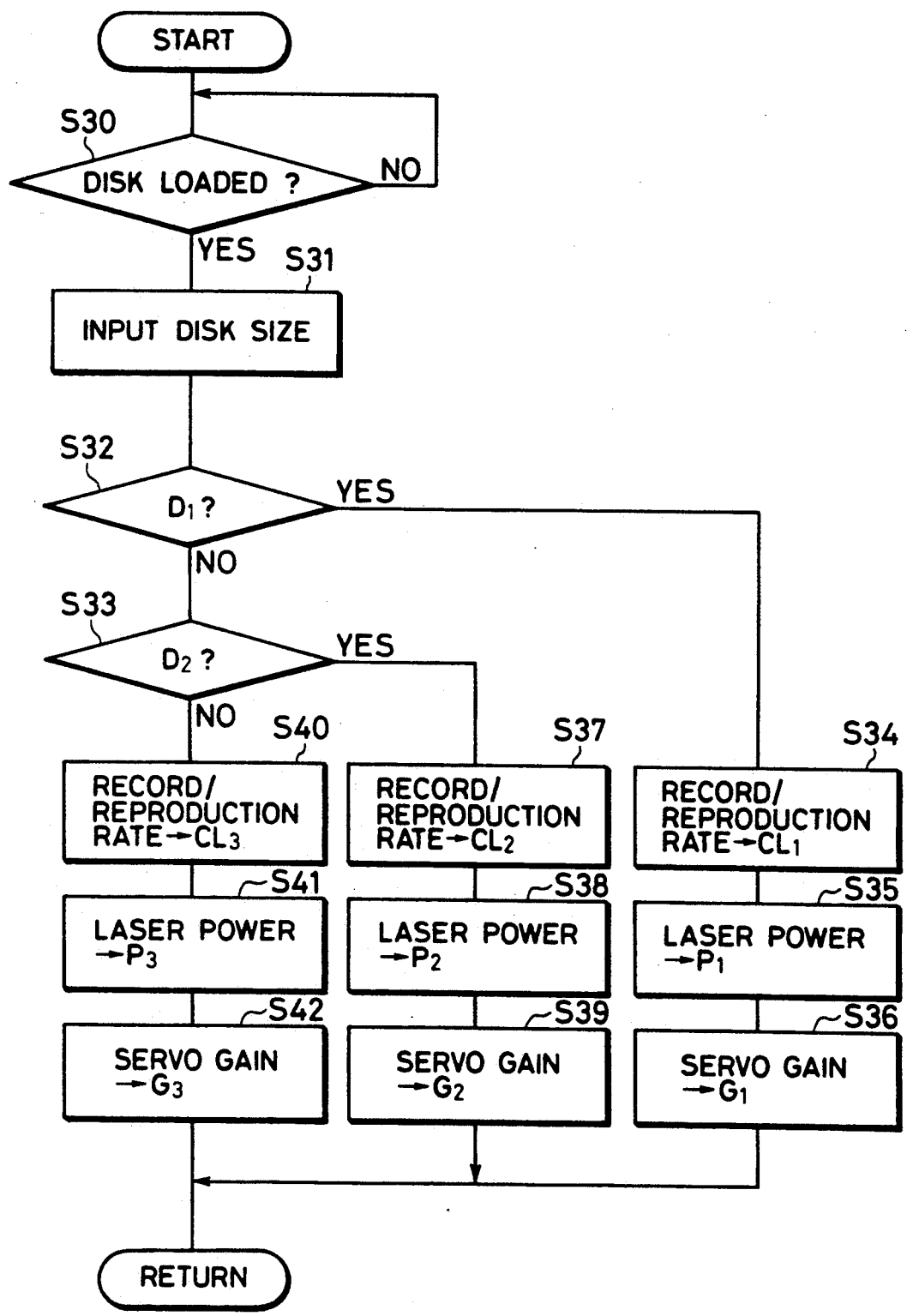
FIG. 24 is a flowchart in the embodiment shown in FIG. 22.

FIG. 24 is a flowchart for the embodiment shown in FIG. 22.

First, when the power supply of the apparatus is turned on, or when the recording disk 130 is removed from the apparatus, the operation is started. A check is made to see if the recording disk 130 has been loaded or not on the basis of the signal from the photo interrupter PI$_3$ provided inside the apparatus (step 30). If the disk 130 has been loaded, the signals from the photo interrupters PI$_2$ and PI$_1$ are inputted (step 31).

When both optical paths of the photo interrupters PI$_2$ and PI$_1$ are interrupted, this means that the recording disk loaded has the maximum diameter (D$_1$) (step 32). In this case, the record/reproduction rate is set to CL$_1$ (step 34). The laser power is set to P$_1$ (step 35). The servo gain of the focus tracking controller circuit 123 is set to G$_1$ (step 36).

When the optical path of the photo interrupter PI$_2$ is interrupted and the photo interrupter PI$_1$ receives the light, it is determined that the diameter of the recording disk loaded is D$_2$ (step 33). Thus, the record/reproduction rate is set to CL$_2$ (step 37). The laser power is set to P$_2$ (step 38). The servo gain of the focus tracking controller circuit 123 is set to G$_2$ (step 39).

When the diameter of the recording disk is neither D$_1$ nor D$_2$, it is decided that the disk diameter is the minimum. Thus, the record/reproduction rate is set to CL$_3$ (step 40). The laser power is set to P$_3$ (step 41). The servo gain of the controller circuit is set to G$_3$ (step 42).

The record/reproduction rates CL$_1$ to CL$_3$ are set by switching a quartz resonator of a reference clock oscillator or a frequency dividing ratio or the like in the reproduced signal processor circuit 124 and laser modulator circuit 125. The laser power is switched by changing over a reference value of the laser power control. The servo gain is switched by changing over resistors in the circuit, or the like.

In the above embodiment, the laser power is constant with respect to the recording disk of the same size; however, it may be varied depending on the radius of recording disk used. In this case, a range of variable laser power is switched in accordance with the disk diameter. On one hand, the servo gain of the processor circuit 124 is also varied in association with the variation in laser power. For this purpose, an AGC (Auto Gain Control) or the like is used. FIG. 23 shows examples of numerical values in this case. Other numerical values different from those values may be used.

Hitherto, two-sided disks have been arranged such that both sides are of the same type of disks. For example, there have been known two-side writable disks (DRAW type disks), two-side disks only for use of reproduction (ROM type disks), and two-side rewritable disks (E-DRAW type disks).

Recently, endeavor has been made to reduce the number of documents and efficiently utilize space in offices by an electronic filing apparatus using optical disks.

The use of the two-sided optical disks of conventional type makes it possible to reduce the number of documents and efficiently utilize the space to certain degrees since their memory capacities are large.

However, in the case of the DRAW type disk, after information has once been recorded, the information cannot be rewritten at the same memory location. Therefore, if temporary information is also recorded, the number of recorded disks increases and there are problems such that it becomes contrary to the efficient use of space and to the saving of resources.

On the other hand, the E-DRAW type disk has a problem of data preservation. For instance, the E-DRAW type disk cannot endure preservation for a long time, of twenty to thirty years, and there is a problem such that it is improper for preservation for a long time in consideration of the inherent rewritability.

The ROM type disk has a problem such that its use range is limited as an information filing disk since new information cannot be recorded.

The disk including different kinds of recording media will now be described.

Figure 25:
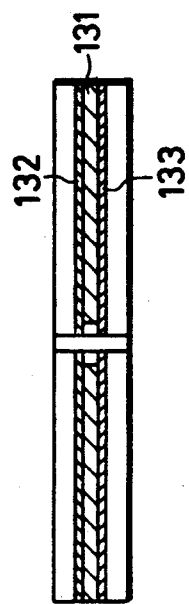
FIG. 25 is a vertical sectional view of a two-side disk.

FIG. 25 is a vertical sectional view of the disk which is used in the invention.

A two-sided disk 131 has a thin photomagnetic film surface (hereinbelow, referred to as an E-DRAW recording surface) 132 and a writable recording surface (hereinafter, referred to as a DRAW recording surface) 133. The E-DRAW recording surface 132 and DRAW recording surface 133 are formed individually by well-known technology and can be easily integrated due to an affixed manner similar to a conventional two-side disk.

Figure 26:
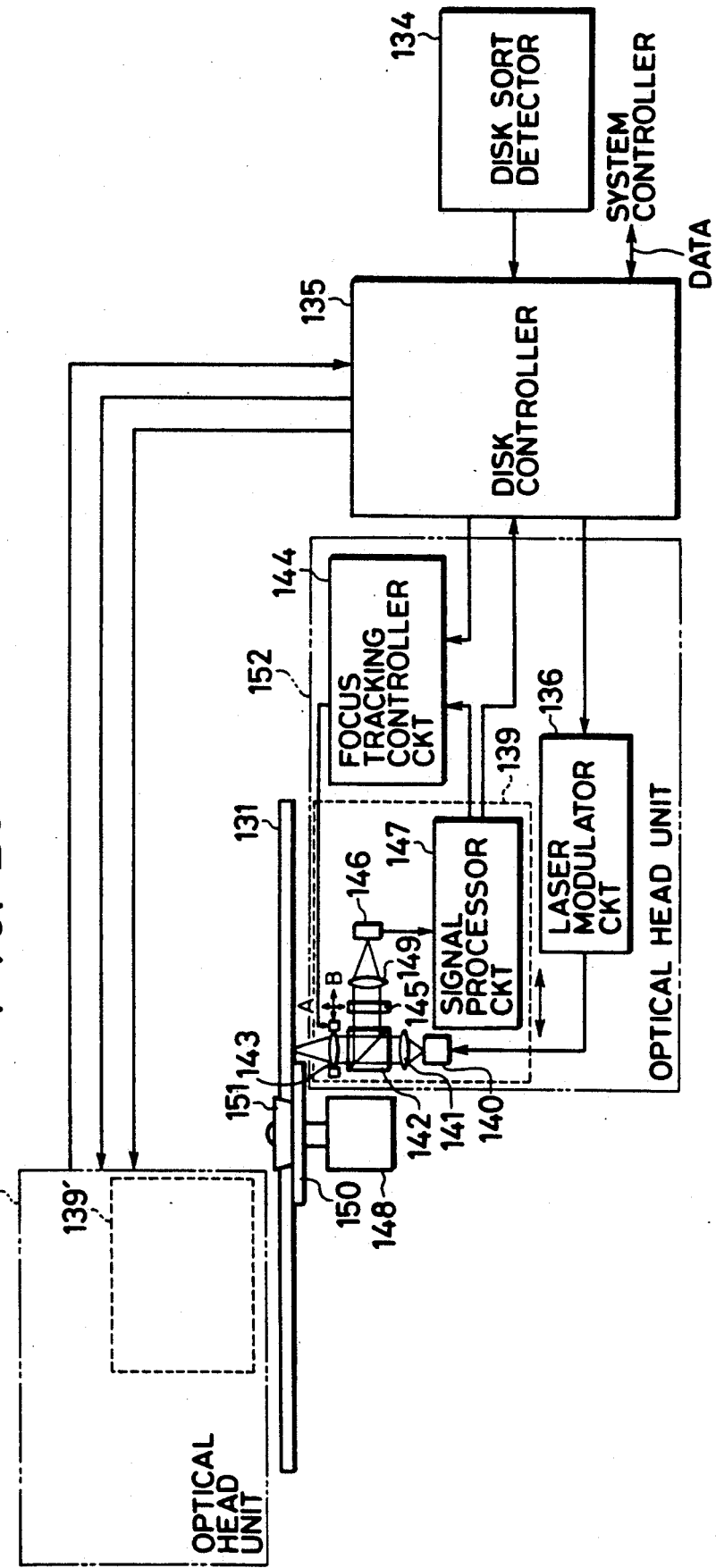
FIG. 26 is a block diagram showing an embodiment of the invention.

FIG. 26 is a block diagram showing an embodiment of the invention.

In FIG. 26, an optical head 139 has a laser source 140, a collimator lens 141 for parallelizing a laser beam from the laser source 140, a beam splitter 142, and an objective lens 143. The objective lens 143 is provided so as to be movable by an actuator in both the vertical direction indicated by the arrows A to focus the laser beam onto the disk 131 and the horizontal direction indicated by the arrows B to track the laser beam.

The optical head 139 also has a condenser lens 149, an analyzer 145 which is used only when information is reproduced, a photo sensitive device 146, and a signal processor circuit 147.

The auto-focus and auto-tracking systems can be realized by using a well-known astigmatic system, a three-beam system, or the like; therefore, their detailed descriptions are omitted. A spindle motor 148 rotates the disk 130 loaded on a turntable 150 by a clamp 151.

A disk sort detector 134 detects the kind of disk (namely, the kind of disk such as a ROM disk, DRAW disk, E-DRAW disk, etc.) and outputs a signal indicative of the kind of disk to a disk controller 135. In this case, the detector 134 detects the kind of disk by the above-described method or the like. The disk controller 135 controls the whole disk apparatus and instructs the laser power corresponding to the kind of disk detected to a laser modulator circuit 136, thereby enabling the power of the semi-conductor laser 140 to be controlled.

A signal from the photo sensitive device 146 is processed by the signal processor circuit 147 and on the basis of this signal, the focus and tracking operations are controlled by a focus tracking controller circuit 144. A gain of the controller circuit 144 is switched in accordance with the laser power.

In FIG. 25, an optical head unit 153 over the disk 131 has substantially the same construction as that of an optical head unit 152 shown below the disk 131 in FIG. 25. A head access mechanism is separately needed to move the optical heads 139 and 139' in the radial direction of the disk 131, respectively. Such a head access mechanism may be realized by respectively independently providing well-known linear motors or the like for the optical heads 139 and 139' or by integrating the optical heads 139 and 139' to form a single common linear motor. The disk sort detector 134 is arranged in a manner such that marks corresponding to the kinds of disks on both sides of the two-sided disk 131 are applied to the cartridge to enclose the disk 131 or to the disk itself and these marks are optically or mechanically detected by a sensor.

The operation of this embodiment will now be described.

Figure 27:
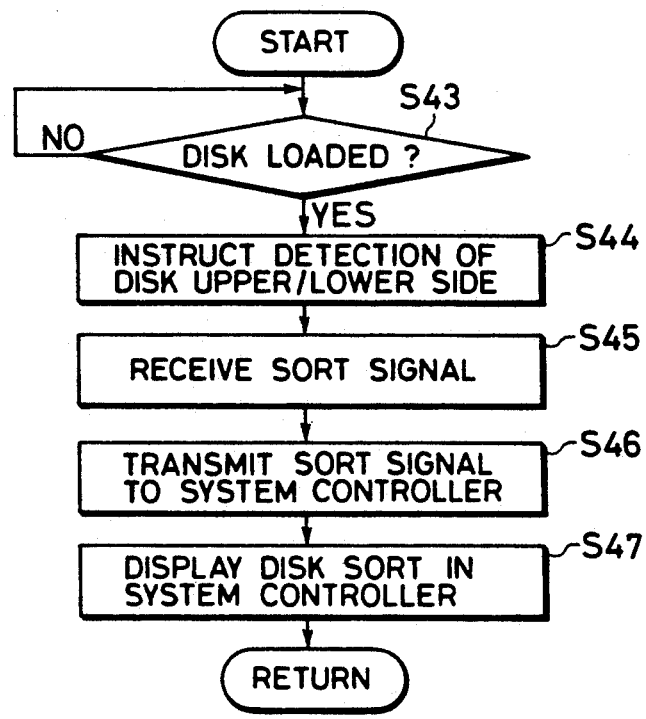
FIG. 27 is a flowchart for discriminating the kind of two-sided disk.

FIG. 27 is a flowchart for identifying the kind of two-side disk.

First, a check is made to see if the two-side disk 131 has been loaded in the disk drive apparatus or not by a sensor (not shown) (step 43). After the disk has been loaded, the disk sort detector 134 instructs the detection of the kind of disk on the upper/lower side of the disk 131 (step 44). A sort signal is received from the disk sort detector 134 (step 45). This sort signal is also transmitted to a system controller (not shown) (step 46). The kind of disk detected is displayed in a system console (not shown) (step 47).

Figure 28:
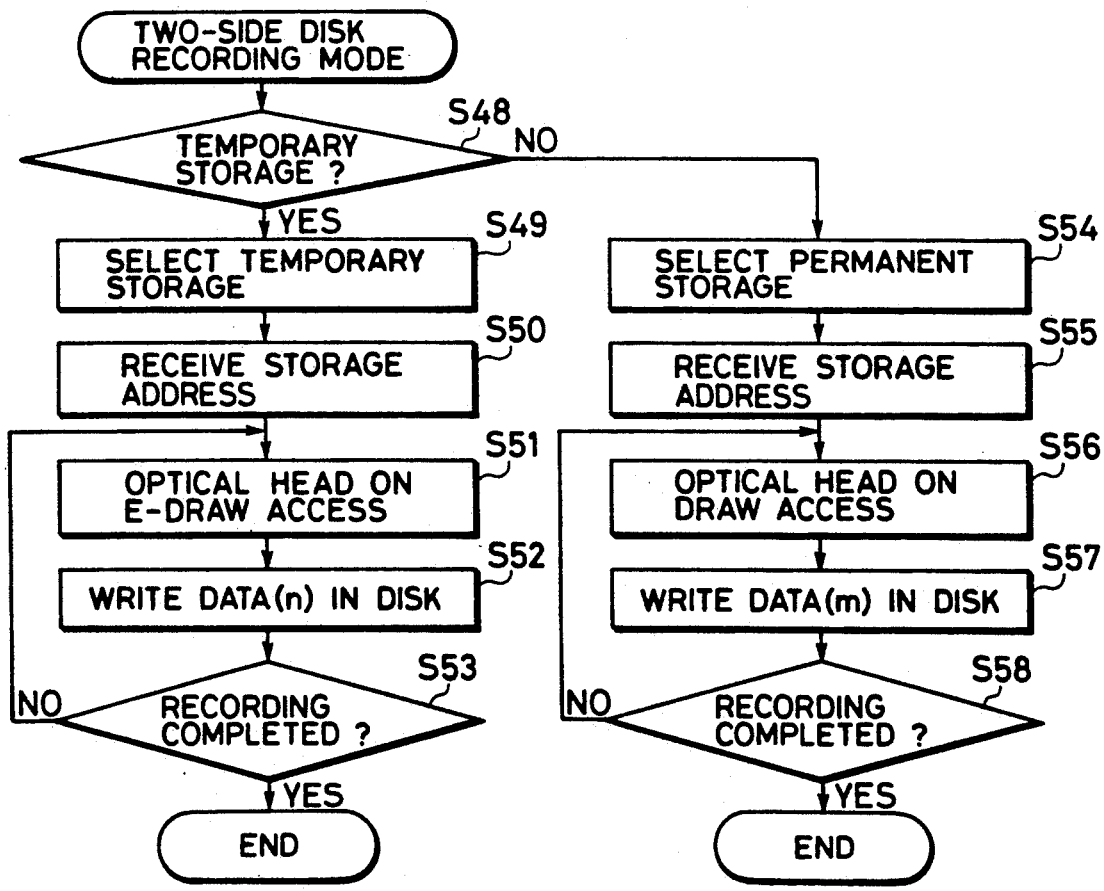
FIG. 28 is a flowchart in the two-sided disk recording mode.

FIG. 28 is a flowchart in the two-sided disk recording mode.

After the two-sided disk recording mode was set, the disk controller 135 sends to the system controller (not shown) a signal indicative of the kind of disk on each of the upper and lower sides of the two-sided disk 131 loaded, namely, representative of the E-DRAW type disk or DRAW type disk. The system controller (not shown) displays the kind of disk on a display device of an operator console, thereby alerting an operator. In this case, it is assumed that the upper side of the two-side disk 131 is the E-DRAW disk and the lower side is the DRAW disk, for convenience of explanation.

A check is then made to see if the storage mode designated by the operator is temporary storage or permanent storage (step 48). For example, when it is now assumed that the operator is performing the image editing work, the operator first selects the temporary storage mode of the optical disk drive apparatus. Thus, a command representative of the temporary storage mode is sent to the disk controller 135 (steps 49 and 50). The disk controller 135 generates a control signal to stand by and access the upper optical head unit 153 in FIG. 26 (step 51). The sample image data to be edited is sequentially recorded in the upper surface (E-DRAW disk) of the two-side disk 131 (step 52) and this recording operation is repeated until the data has completely been stored (step 53).

Namely, the E-DRAW disk surface is used as a working image memory area.

After the image data as the edited result has been finally determined, this image data is permanently recorded. In this case, the storage mode of the optical disk drive apparatus is set to the permanent storage mode by the operator. Thus, the permanent storage mode is instructed to the disk controller (steps 54 and 55) and the lower optical head unit 152 corresponding to the lower side (DRAW disk) of the two-side disk 131 in FIG. 26 starts the auto-focus, auto-tracking, accessing operations, and the like (step 56). The resulting from the above-described edit data is recorded in a predetermined address of the disk (step 57) and the recording operation is repeated until the data has completely been stored (step 58).

For the E-DRAW disk used as a working memory area, the erasure of the recorded information is instructed or it is automatically erased as necessary after completion of the work.

In the case wherein the thin photomagnetic film is used as the E-DRAW disk, it is necessary to set a magnitude of the bias magnetic field which is inverted in the perpendicular direction of the disk surface to hundreds of oersteds in the recording or erasing operation. This can be realized by oppositely arranging well-known electromagnets or permanent magnets so as to sandwich the disk surfaces of the optical head.

With this arrangement, the kind of disk to be used is automatically selected in accordance with the selected one of the temporary storage mode and the permanent storage mode of the data, so that the optimum use method corresponding to the recording medium can be certainly selected. In addition, since two optical head units correspond to the respective disk surfaces, the exchanging time of the medium can be saved. Further, by setting only a single two-side disk, the system can be efficiently used by only one external memory device.

In the above embodiment, the two-side disk consisting of the E-DRAW type disk and DRAW type disk has been described. However, the same shall apply to the case of the two-side disk consisting of the E-DRAW type disk and ROM type disk. That is, in general, the operating system (OS) or manual, format, or the like of the system is preliminarily recorded in the ROM disk. In this case, the operator can efficiently use the system by using the single two-side disk. In addition, the same shall apply to the two-side disk consisting of the ROM type disk and DRAW type disk, as well.

In the case of using the E-DRAW disk as a buffer memory, it will be convenient to use it as an electronic mailbox of an LAN (Local Area Network). Practically speaking, the transmitted electron mail is once automatically recorded in the E-DRAW disk and the operator reads it out later and can preserve the necessary information in this electronic mail in the DRAW disk as necessary.

The present invention is not limited to the foregoing embodiments, but many modifications and variations are possible within the spirit and scope of the appended claims of the invention.

What is claimed is:

1. An information recording apparatus comprising:
   recording means for recording information on a recording medium having at least one information track recorded thereon;
   identifying means for identifying the difference between recording media which employ different recording and reproducing methods, respectively, wherein said identifying means comprises reading means for reading out identification code information from said at least one information track with the same reading operation condition regardless of the difference between the recording media and means for identifying the difference between recording media on the basis of the identification code information read out by said reading means, said difference between recording media to be identified, being at least two types selected from only-reproducible type media, writable-and reproducible type media and writable-reproducible-erasable type media; and
   control means for performing a control operation controlling an operation parameter of said recording means in response to the type of recording medium identified by said identifying means when the type of the recording medium is identified by said identifying means, and for cancelling performance of the control operation when the type of the recording medium is not identified by said identifying means.

2. An information recording apparatus according to claim 1, wherein said recording medium includes an optical recording medium.

3. An information recording apparatus according to claim 1, wherein said reading means includes irradiating means for irradiating a light beam, and wherein said reading means reads the identification information by irradiating a predetermined quantity of light onto said recording medium.

4. An information recording apparatus according to claim 1, further comprising detecting means for detecting when said recording medium has been loaded into said apparatus, wherein said identifying means automatically starts an identifying operation when said detecting means detects that said recording medium has been loaded into said apparatus.

5. An information recording apparatus according to claim 4, wherein the identification information has been recorded onto a predetermined recording track of said recording medium and wherein said identifying means moves said reading means to said predetermined recording track.

6. An information recording apparatus according to claim 1, wherein said recording means includes a head for recording information onto said recording track of said recording medium and wherein said head serves as said reading means.

7. An information recording apparatus according to claim 1, wherein said identifying means sets an operation parameter of said reading means at a predetermined value, and wherein said reading means reads out the identification information in accordance with the operation parameter.

8. An information recording apparatus according to claim 1, wherein said recording means includes irradiating means for irradiating a light beam and wherein said control means controls a quantity of light from said irradiating means.

9. An information recording apparatus according to claim 1, wherein said recording means includes a tracking control circuit for tracking said recording medium, and wherein said control means controls a servo gain of said tracking control circuit.

10. An information recording apparatus according to claim 1, wherein said recording means includes an error correcting circuit and wherein said control means controls a redundancy of said error correcting circuit in response to the identifying by said identifying means.

11. An information reproducing apparatus comprising:
    reproducing means for reproducing information from a recording medium having at least one information track recorded thereon;
    identifying means for identifying the difference between recording media which employ different recording and reproducing methods, respectively, wherein said identifying means includes reading means for reading out identification code information from said at least one information track with the same reading operation condition regardless of the difference between the recording media and means for identifying the difference between the recording media on the basis of the identification code information read out by said reading means, said difference between recording media to be identified, being at least two types selected from only-reproducible type media, writable-and reproducible type media and writable-reproducible-erasable type media; and
    control means for performing a control operation controlling an operation parameter of said reproducing means in response to the type of recording medium identified by said identifying means when the type of the recording medium is identified by said identifying means, and for cancelling performance of the control operation when the type of the recording medium is not identified by said identifying means.

12. An information reproduction apparatus according to claim 11, wherein said recording medium includes an optical recording medium.

13. An information reproducing apparatus according to claim 12, wherein said reading means includes irradiating means for irradiating a light beam, and wherein said reading means reads the information identification by irradiating a predetermined quantity of light onto said recording medium.

14. An information reproducing apparatus according to claim 11, wherein said reproducing means includes a head for reading the information recorded on said recording track of said recording medium and wherein said head serves as said reading means.

15. An information reproducing apparatus according to claim 11, wherein said identifying means sets an operation parameter of said reading means at a predetermined value, and wherein said reading means reads out the identification information in accordance with the operation parameter.

16. An information reproducing apparatus according to claim 11, wherein said reproducing means includes irradiating means for irradiating a light beam and wherein said control means controls a quantity of light from said irradiating means.

17. An information reproducing apparatus according to claim 11, wherein said reproducing means includes a tracking control circuit for tracking said recording medium, and wherein said control means controls a servo gain of said tracking control circuit.

18. An information reproducing apparatus according to claim 11, wherein said reproducing means includes a head for reading out the information recorded on said recording track of said recording medium and a signal processing circuit for amplifying and processing a signal corresponding to the information read out by said head, and wherein said control means controls a gain of said signal processing circuit.

19. An information reproduction apparatus according to claim 18, wherein said signal processing circuit includes a feedback loop having a feedback resistance and wherein said control means controls a value of said feedback resistance in response to the identifying by said identifying means.

20. An information reproduction apparatus according to claim 18, wherein said signal processing circuit includes a resistance for changing a level of said amplified signal, and wherein said control means controls a value of said resistance in response to the identifying by said identifying means.

21. An information reproducing apparatus according to claim 11, further comprising detecting means for detecting when said recording medium has been loaded into said apparatus, wherein said identifying means automatically starts an identifying operation when said detecting means detects that said recording medium has been loaded into said apparatus.

22. An information reproduction apparatus according to claim 21, wherein the identification information has been recorded onto a predetermined recording track of said recording medium and wherein said detecting means moves said reading means to said predetermined recording track.

23. An information reproduction apparatus according to claim 11, wherein said reproducing means includes an error correcting circuit and wherein said control means controls a redundancy of said error correcting circuit in response to the identifying by said identifying means.

* * * * *

UNITED STATES PATENT AND TRADEMARK OFFICE
CERTIFICATE OF CORRECTION

PATENT NO. : 5,289,451
DATED : February 22, 1994
INVENTOR(S) : TAKAAKI ASHINUMA, ET AL.

It is certified that error appears in the above-indentified patent and that said Letters Patent is hereby corrected as shown below:

ABSTRACT [57],
　Line 4, "represented." should read --presented.--.

SHEET 4 OF THE DRAWINGS,
　In Figure 10, in step S7, "EDRAW" should read --E-DRAW--.

Column 2,
　Line 37, "used" (first occurrence) should read --used,--.

Column 3,
　Line 67, "FIG. 21A" should read --FIGS. 21A--.
　Line 67, "formal" should read --format--.

Column 5,
　Line 7, "$V_1<V_b<V_2,;$" should read --$V_1<V_b<V_2,$--.
　Line 36, "interrupted" should read --interrupted,--.

Column 11,
　Line 53, "modulat-ing" should read --modulating--.

Column 15,
　Line 57, "two-side" should read --two-sided--.
　Line 58, "two-side" should read --two-sided--.

UNITED STATES PATENT AND TRADEMARK OFFICE
CERTIFICATE OF CORRECTION

PATENT NO. : 5,289,451
DATED : February 22, 1994
INVENTOR(S) : TAKAAKI ASHINUMA, ET AL.

It is certified that error appears in the above-indentified patent and that said Letters Patent is hereby corrected as shown below:

Column 16,
    Line 12, "side" should read --sided--.
    Line 26, "two-side" should read --two-sided--.
    Line 38, "two-side" should read --two-sided--.
    Line 40, "The" should read --The data--.
    Line 65, "two-side" should read --two-sided--.
    Line 67, "two-side" should read --two-sided--.

Column 17,
    Line 2, "two-side" should read --two-sided--.
    Line 7, "two-side" should read --two-sided--.
    Line 8, "two-side" should read --two-sided--.
    Line 40, "writable - and" should read --writable-and- --.
    Line 57, "claim 1," should read --claim 2,--.

Column 18,
    Line 51, "writable - and" should read --writable-and- --.
    Line 63, "reproduction" should read --reproducing--.

Column 19,
    Line 1, "information identification" should read --identification information--.

UNITED STATES PATENT AND TRADEMARK OFFICE
CERTIFICATE OF CORRECTION

PATENT NO. : 5,289,451
DATED : February 22, 1994
INVENTOR(S) : TAKAAKI ASHINUMA, ET AL.

It is certified that error appears in the above-indentified patent and that said Letters Patent is hereby corrected as shown below:

Column 20,
    Line 1, "reproduction" should read --reproducing--.
    Line 7, "reproduction" should read --reproducing--.
    Line 20, "reproduction" should read --reproducing--.
    Line 26, "reproduction" should read --reproducing--.

Signed and Sealed this

Thirteenth Day of September, 1994

Attest:

BRUCE LEHMAN

Attesting Officer     Commissioner of Patents and Trademarks